US008000481B2

(12) United States Patent
Nishikawa

(10) Patent No.: US 8,000,481 B2
(45) Date of Patent: Aug. 16, 2011

(54) SPEAKER ARRAY AND MICROPHONE ARRAY

(75) Inventor: Kiyoshi Nishikawa, Hakusan (JP)

(73) Assignees: Yamaha Corporation, Hamamatsu-shi (JP); National University Corporation, Kanazawa University, Kanazawa-shi (JP)

( * ) Notice: Subject to any disclaimer, the term of this patent is extended or adjusted under 35 U.S.C. 154(b) by 1337 days.

(21) Appl. No.: 11/546,774

(22) Filed: Oct. 12, 2006

(65) Prior Publication Data

US 2007/0081677 A1 Apr. 12, 2007

(30) Foreign Application Priority Data

Oct. 12, 2005 (JP) ................................ 2005-298231

(51) Int. Cl.
*H04R 3/00* (2006.01)
*H04B 3/00* (2006.01)
*H04B 5/00* (2006.01)
*H03G 5/00* (2006.01)

(52) U.S. Cl. ............. 381/92; 381/77; 381/79; 381/111; 381/98; 381/122

(58) Field of Classification Search .................... 381/59, 381/92, 98, 77, 79, 99, 111, 122
See application file for complete search history.

(56) References Cited

FOREIGN PATENT DOCUMENTS

EP 0 381 498 8/1990

OTHER PUBLICATIONS

Nishikawa, K., et al.—"Wideband Beamforming Using Fan Filter"; (Proceedings of the International Symposium on Circuits and Systems; San Diego, May 10-13, 1992).

Nishikawa, K., et al.—"A Design Method of 2d FIR Fan Filters for Wideband Beam Forming Means of 2d Fourier Series Approximation"; (Electronic & Communications in Japan, Part III—Fundamental Electronic Science (Wiley, Hoboken, NJ, US) vol. 85, No. 7, Part 3, 2002, pp. 38-49, XP001102659—ISSN: 1042-0967.

Nishikawa, K., et al.—"A Method for Changing Sound-Image Position Using the Linear Loudspeaker Array and Two-Dimensional FIR Digital Filter"; (Electronics & Communications in Japan, Part III—Fundamental Electronic Science, (Wiley, Hoboken, NJ, US) vol. 85, No. 4, Part 3, Apr. 2002; Part 3, Apr. 2002, pp. 20-31, XP001124737; ISSN: 1042-0967.

*Primary Examiner* — Devona E Faulk
*Assistant Examiner* — George Monikang
(74) *Attorney, Agent, or Firm* — Pillsbury Winthrop Shaw Pittman LLP

(57) ABSTRACT

A speaker array, includes a plurality of speakers which are linearly arranged at a predetermined interval; and one-dimensional digital filters which are provided to correspond to the speakers respectively, in which predetermined filter coefficients are set previously, and which apply a filtering process to input sound data in response to the filter coefficients to output. Sound data derived by applying a digital conversion to input sound signals are supplied to respective one-dimensional digital filters. Sound signals derived by applying an analog conversion to the sound data output from respective one-dimensional digital filters are supplied to corresponding speakers to output a sound in response to the sound signals. The filter coefficients set in respective one-dimensional digital filters give an amplitude characteristic to a two-dimensional digital filter such that, when a frequency characteristic of the two-dimensional digital filter constructed by respective one-dimensional digital filters is represented by a two-dimensional frequency plane, a plurality of ripples are provided in a stop band in a section in a spatial frequency direction and also an amplitude of ripples in a non-physical area out of a plurality of ripples is larger than an amplitude of ripples in a physical area.

4 Claims, 13 Drawing Sheets

——— : Parks & McClellant CHARACTERISTIC δn = 1.0
------ : Dolph-Chebyshev CHARACTERISTIC δn = 0.1

SPEAKER ARRAY AND MICROPHONE ARRAY

BACKGROUND OF THE INVENTION

The present invention relates to the technology to improve a directivity of a speaker array and a microphone array and, more particularly, the technology to improve a directivity in a low frequency range.

The technology to form a sound field only in a particular direction or pick up a sound arriving only from a particular direction by using the speaker array or the microphone array, which is constructed by aligning a plurality of transducers such as speakers or microphones linearly at a predetermined interval, has spread popularly.

By the way, in the speaker array and the microphone array of this type, it is desired that the same directional characteristic can be realized over a wide band from a high frequency range to a low frequency range. In this case, the directional characteristic in a low frequency range can be improved as an array length (a value obtained by multiplying the number of transducers by an aligned interval of the transducers) of the speaker array or the microphone array is set longer (see Non-Patent Literature 1). Therefore, such a problem existed that, in order to ensure the enough directivity in a low frequency range, a device size of the speaker array and the microphone array is inevitably increased.

Therefore, the technologies to solve the above problem have been proposed variously in the prior art, and the technology disclosed in Non-Patent Literature 2 may be listed as an example. In this Non-Patent Literature 2, the technology to expand the band, which is able to provide the same directional characteristic, toward the low frequency range side by setting filter coefficients of respective digital filters such that the amplitude characteristic of the digital filter connected to each transducer constituting the speaker array or the microphone array becomes equal to the amplitude characteristic (or its approximate characteristic) of the Dolph-Chebychev filter, whose section taken in a two-dimensional frequency plane in the spatial frequency direction gives the stop band equal ripple characteristic, is disclosed.

[Non-Patent Literature 1] Toshiro Ohga, Yoshio Yamazaki and Yutaka Kaneda, "Acoustic System and Digital Signal Process" IEICE 1993-05 pp. 176-186

[Non-Patent Literature 2] Yasushi Matsumoto, Kiyoshi Nishikawa, "Approach of Designing a Directional Array Speaker with a Predetermined Side Lobe Amount" IEICE, Technical Report 2004-74 pp. 13-18

However, normally the ripples having the stop band equal ripple characteristic exist in areas except the non-physical area (area in which $|f2|>\rho|f1|$ is satisfied in a two-dimensional frequency plane. Where $\rho=D/cT$, T is sampling interval, D is interval of speakers, and c is sound velocity f1 is normalized time frequency, and f2 is normalized spatial frequency.). Therefore, if a large amplitude is given to the stop band equal ripple to improve the directivity in a low frequency range, such a problem arose that an amplitude level of the side lobes that generate the essentially unnecessary directional characteristic is increased.

SUMMARY OF THE INVENTION

The present invention has been made in view of the above problems, and it is an object of the present invention to provide the technology capable of improving a directivity of a speaker array and a microphone array in a low frequency range without extension of an array length and also avoiding an increase in amplitude level of side lobes.

In order to solve the above problems, the present invention provides a speaker array, which includes a plurality of speakers linearly arranged at a predetermined interval; and one-dimensional digital filters which are provided to correspond to the plurality of speakers respectively, in which predetermined filter coefficients are set previously, and which apply a filtering process to input sound data in response to the filter coefficients to output, whereby sound data derived by applying a digital conversion to input sound signals are supplied to respective one-dimensional digital filters whereas sound signals derived by applying an analog conversion to the sound data output from respective one-dimensional digital filters are supplied to corresponding speakers to output a sound in response to the sound signals; wherein the filter coefficients set in respective one-dimensional digital filters give an amplitude characteristic to a two-dimensional digital filter such that, when a frequency characteristic of the two-dimensional digital filter constructed by respective one-dimensional digital filters is represented by a two-dimensional frequency plane, a plurality of ripples are provided in a stop band in a section in a spatial frequency direction and also amplitudes of ripples in a non-physical area out of the plurality of ripples are larger than amplitudes of ripples in a physical area.

Also, in order to solve the above problems, the present invention provides a microphone array, which includes a plurality of microphones aligned linearly at a predetermined interval; and one-dimensional digital filters which are provided to correspond to the plurality of microphones respectively, in which predetermined filter coefficients are set previously, and which apply a filtering process to input sound data in response to the filter coefficients to output, whereby sound data derived by applying a digital conversion to sound signals output from the plurality of microphones respectively are supplied to corresponding one-dimensional digital filters whereas a sum signal of sound data output from respective one-dimensional digital filters is output; wherein the filter coefficients set in respective one-dimensional digital filters give an amplitude characteristic to a two-dimensional digital filter such that, when a frequency characteristic of the two-dimensional digital filter constructed by respective one-dimensional digital filters is represented by a two-dimensional frequency plane, a plurality of ripples are provided in a stop band in a section in a spatial frequency direction and also an amplitude of ripples in a non-physical area out of the plurality of ripples is larger than an amplitude of ripples in a physical area.

Preferably, the ripples in the non-physical area have substantially same amplitudes to each other.

Preferably, a first ripple and a second ripple are provided in the stop band of the non-physical area. An amplitude of the first ripple is greater than an amplitude of a ripple provided in a pass band of the non-physical area. An amplitude of the second ripple is smaller than the amplitude of the first ripple and is greater than the ripple provided in the stop band of the physical area.

According to the present invention, such advantages are achieved that the directivity of the speaker array and the microphone array in a low frequency range can be improved without extension of an array length, and also an increase in level of the side lobes can be avoided.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

A best mode for carrying out the present invention will be explained with reference to the drawings hereinafter.

A. First Embodiment (A-1: Configuration)

Figure 1:
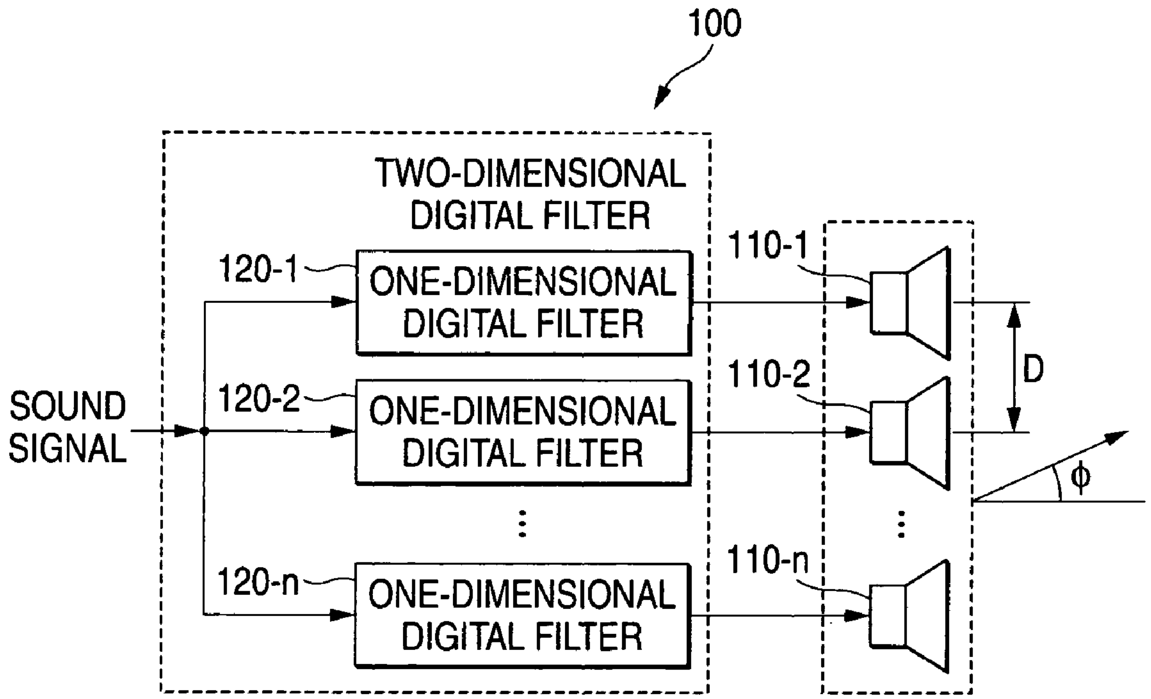
FIG. 1 is a block diagram showing an electric configuration of a speaker array 100 according to a first embodiment of the present invention.

FIG. 1 is a block diagram showing an electric configuration of a speaker array 100 according to a first embodiment of the present invention. As shown in FIG. 1, the speaker array 100 has transducers (speakers in the present embodiment) 110-1, 110-2, . . . , 110-*n* aligned linearly at a predetermined interval (constant interval D in the present embodiment), and one-dimensional digital filters 120-1, 120-2, . . . , 120-*n* as many as these speakers.

In the speaker array 100 in FIG. 1, a sound signal (analog signal) supplied from an external sound source (not shown) is converted into digital data (referred to as sound data hereinafter) by an A/D converter (not shown). Then, the sound data are supplied to one-dimensional digital filters 120-*i* (i: a natural number of 1 to n, this is true of the following) respectively.

A filter coefficient peculiar to the speaker array according to the present invention is set previously in the one-dimensional digital filters 120-*i* in FIG. 1 respectively. The one-dimensional digital filters 120-*i* apply the filtering process responding to the filter coefficient to the sound data transferred from the A/D converter, and then output the data.

Then, the sound data output from the one-dimensional digital filters 120-*i* respectively are converted into a sound signal by a D/A converter (not shown), and then supplied to the speakers 110-*i* corresponding to the one-dimensional digital filters 120-*i*. As a result, the sound corresponding the sound signal supplied from the D/A converter is produced from the speakers 110-*i* respectively.

With the above, the configuration of the speaker array 100 is explained.

As described above, a hardware configuration of the speaker array 100 according to the present embodiment is not different from a hardware configuration of the speaker array in the prior art at all. However, in the speaker array 100 according to the present embodiment, a filter coefficient peculiar to the speaker array according to the present invention is set to the one-dimensional digital filters 120-*i* respectively. Therefore, the amplitude characteristic peculiar to the speaker array according to the present invention is given to the two-dimensional digital filter constructed by these one-dimensional digital filters, and thus the directional characteristic peculiar to the speaker array according to the present invention can be realized.

Then, the amplitude characteristic of the two-dimensional digital filter constructed by the one-dimensional digital filters 120-*i* and the directional characteristic attained by the amplitude characteristic will be explained with reference to the drawings hereunder. Here, suppose in the following that the speakers 110-*i* have the ideal characteristic (i.e., the characteristic such that the directional characteristic does not depend on a frequency of an output sound) respectively. Also, suppose in the following that an aligned interval between the speakers is D=0.068 [m], a sampling frequency is fs=6087 [Hz], the number of FIR taps is 61, and the number of speakers is n=15.

(A-2: Amplitude Characteristic and Directional Characteristic of Two-dimensional Digital Filter)

FIG. 2 to FIG. 6 are views showing an amplitude characteristic of a two-dimensional digital filter of the speaker array 100 and a directional pattern accomplished by the amplitude characteristic.

Figure 2:
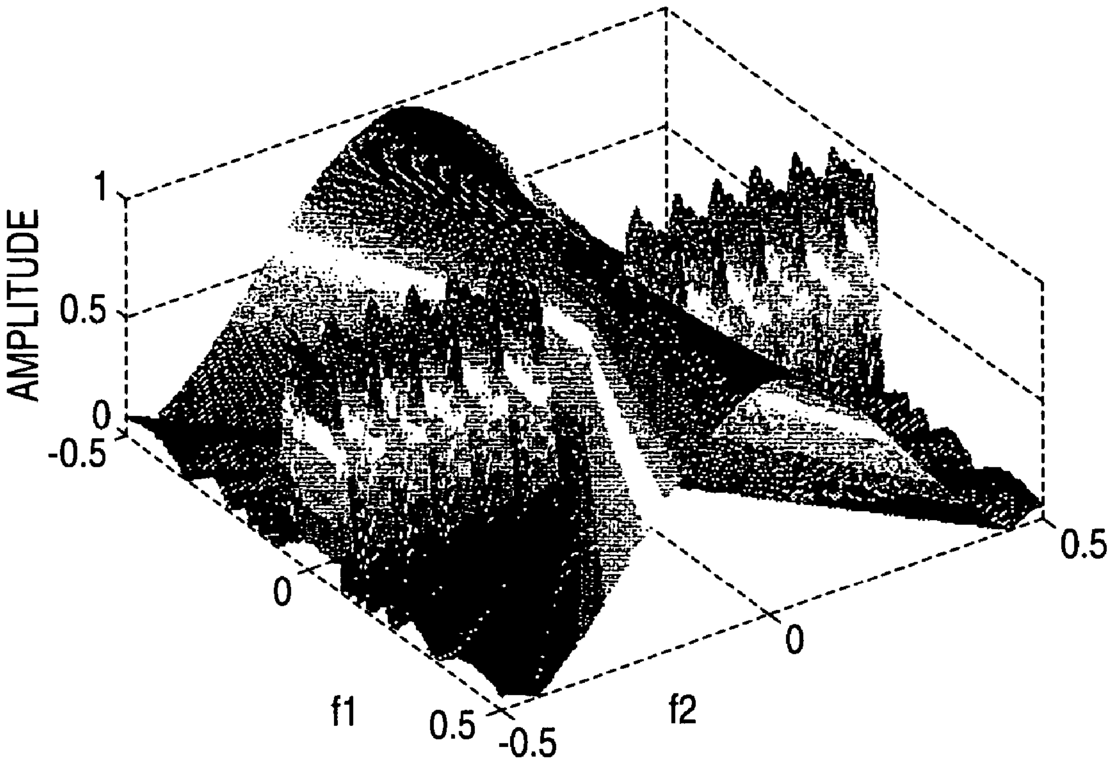
FIG. 2 is a view showing an example of an amplitude characteristic of a two-dimensional digital filter of the speaker array 100 by using a two-dimensional frequency plane.
Figure 3:
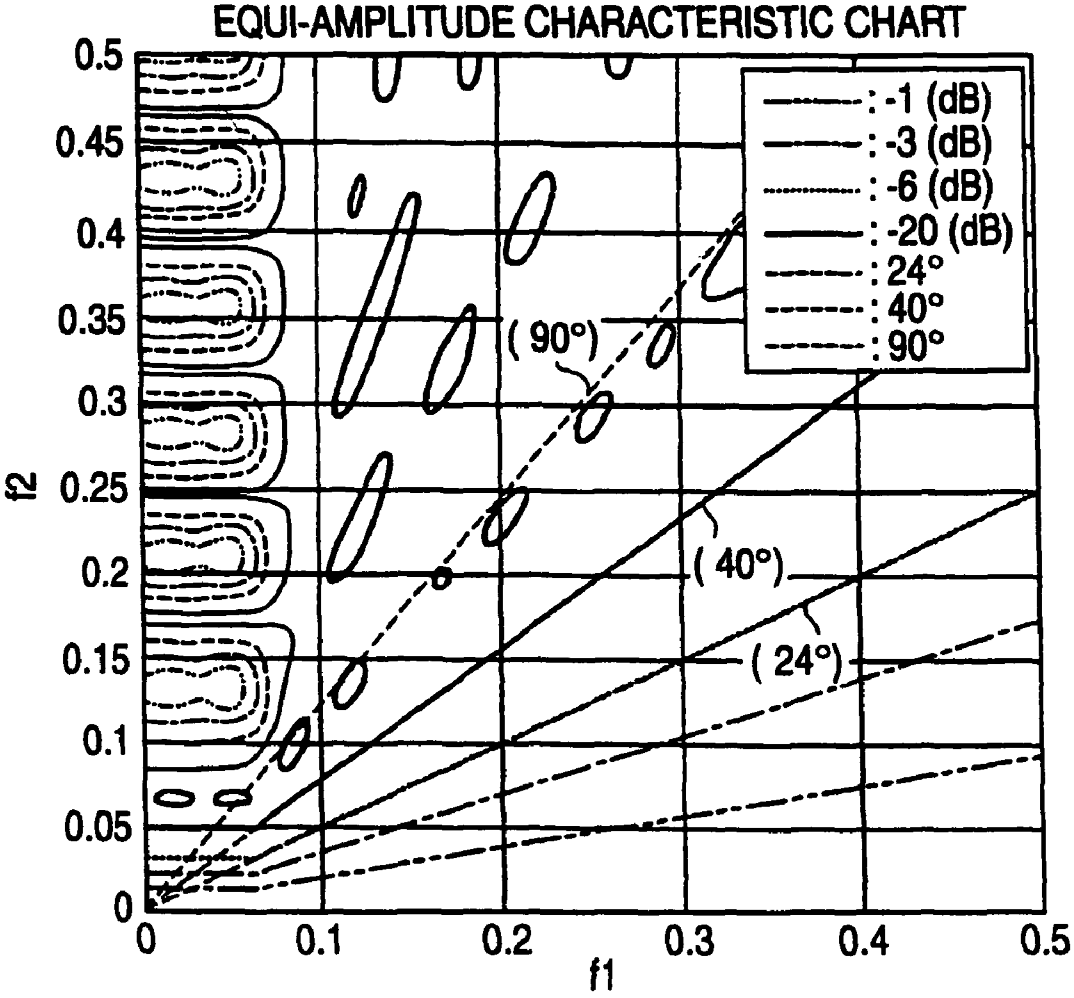
FIG. 3 is a chart showing a part of the amplitude characteristic by using an equi-amplitude characteristic diagram.

FIG. 2 is a view showing an amplitude characteristic of a two-dimensional digital filter constructed by one-dimensional filter 120-*i* using a two-dimensional frequency plane. FIG. 3 is a chart showing a part of the amplitude characteristic shown in FIG. 2 (concretely, a range of a normalized time frequency f1 is 0 to 0.5 and a range of a normalized spatial frequency f2 is 0 to 0.5) by means of an equi-amplitude characteristic diagram. Here, the "normalized time frequency" denotes a value obtained by normalizing a time frequency by a reciprocal number of a time sampling interval, and the "normalized spatial frequency" denotes a value obtained by normalizing a spatial frequency by a reciprocal number of the aligned interval D between the speakers.

As apparent by referring to FIG. 2 and FIG. 3, in the speaker array 100 according to the present embodiment, a plurality of ripples are provided in the range in which the normalized time frequency f1 of the stop band is low (for example, the range in which f1 is 0 to 0.1). Also, a large amplitude ("1" in the present embodiment) is given to ripples in the non-physical area among the plurality of ripples, and amplitudes of ripples in the physical area are suppressed lower than the ripples in the non-physical area. In this case, as apparent from FIG. 2 and FIG. 3, the ripples in the non-physical area are the equi-ripples whose amplitudes are substantially equal, and therefore the amplitude characteristic shown in FIG. 2 and FIG. 3 is called a stop band two-stage equi-ripple characteristic.

Figure 4:
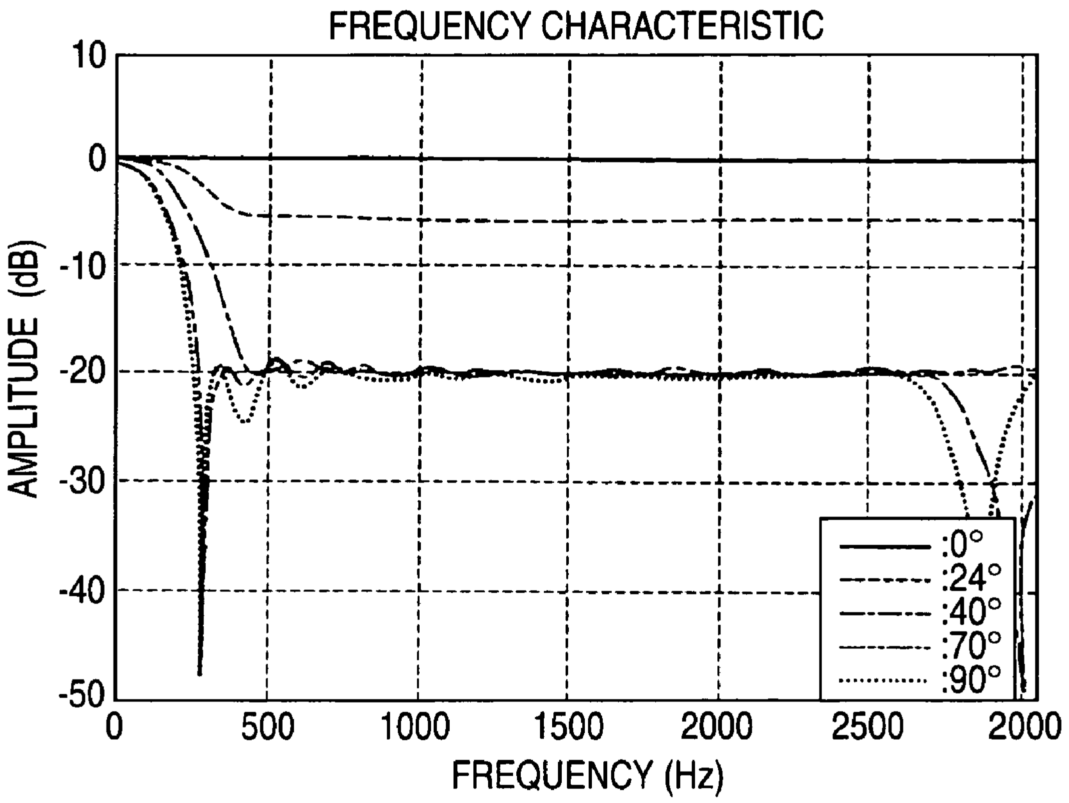
FIG. 4 is a graph in which the amplitude-frequency characteristic of the speaker array 100 is plotted every predetermined angle.

FIG. 4 is a graph showing the amplitude characteristic shown in FIG. 2 as the frequency characteristic with respect to an angle (angle $\phi$ in FIG. 1) to an observation point direction viewed from the center of the speaker alignment when a direction perpendicular to the alignment direction of the speakers 110-*i* is set to 0 degree in a plane that includes respective speakers 110-*i* and observation points of the sound output from the speaker array 100. Here, in FIG. 4, frequency characteristics at $\phi$=0°, 24°, 40°, 70°, and 90° are illustrated.

As apparent by referring to FIG. 4, it is understood that, when the frequency is higher than a predetermined level, an amplitude level of the acoustic beam output from the speaker array 100 in the $\phi$=24° direction is decreased lower than that in the $\phi$=0° direction by about 6 dB and also amplitude levels in the $\phi$=40°, 70°, and 90° directions are decreased lower than that in the $\phi$=0° direction by about 20 dB.

Figure 5:
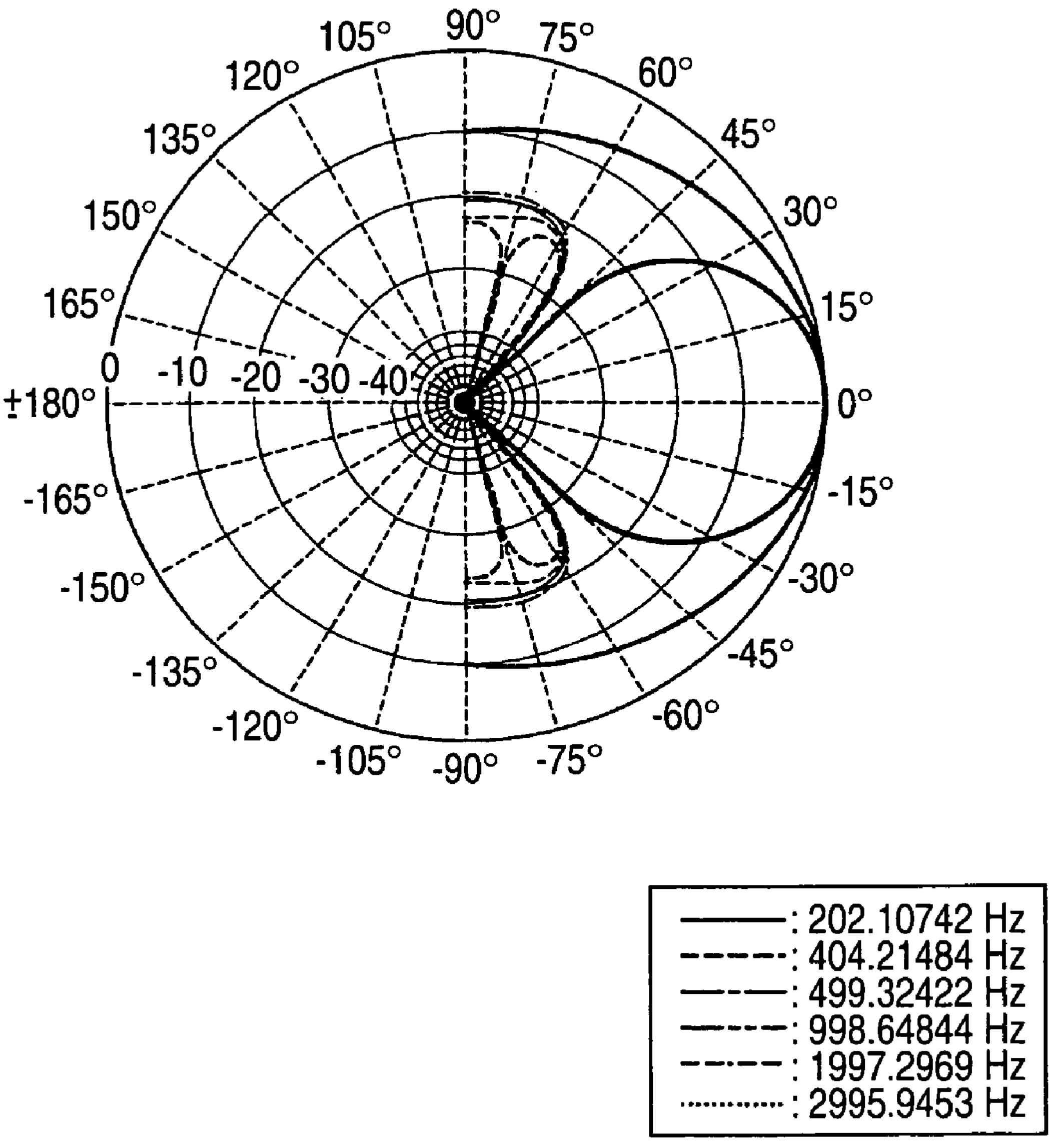
FIG. 5 is a chart in which a directional characteristic of the speaker array 100 is plotted every predetermined frequency.

FIG. 5 is a chart showing the amplitude characteristic shown in FIG. 2 as the directional characteristic at several frequencies (202.10742 Hz, 404.21484 Hz, 499.32422 Hz, 998.64844 Hz, 1997.2969 Hz, and 2995.9453 Hz).

As apparent from FIG. 4 and FIG. 5, it is understood that, in the speaker array 100 according to the present embodiment, a level of the side lobe can be maintained substantially constant (in this case, −20 dB) at a frequency in excess of a predetermined value, while keeping a width of the main lobe of the acoustic beam constant.

Figure 6:
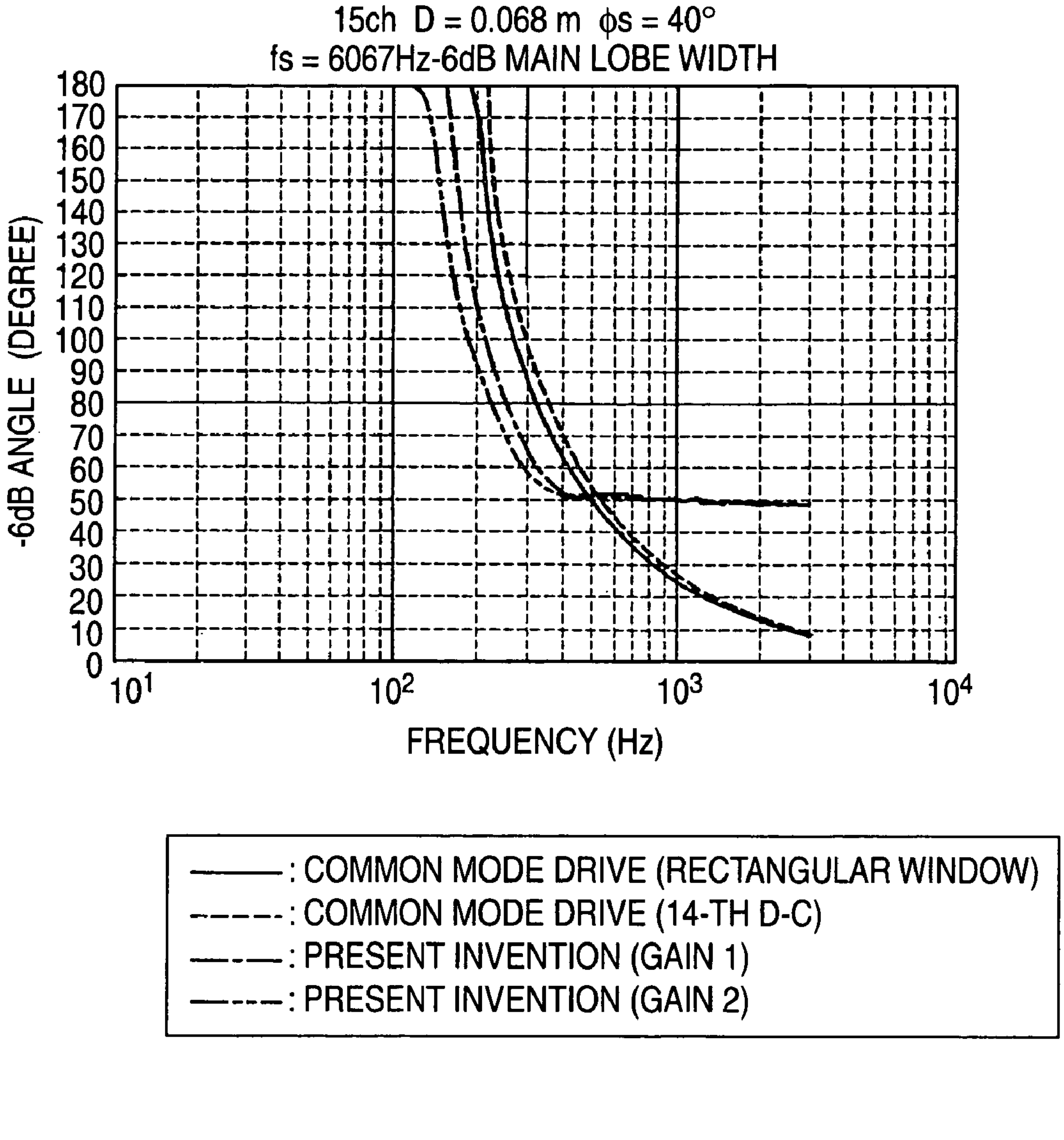
FIG. 6 is a graph showing a relationship between a frequency of the acoustic beam output from the speaker array 100 and a main lobe width of the acoustic beam.

FIG. 6 is a graph in which a main lobe width (an angle indicating a width of an area, in which the amplitude of the acoustic beam is attenuated by 6 dB, to a $\phi$=0° direction) is plotted with regard to the speaker array 100 according to the present embodiment and the speaker array under the rectangular common-mode drive (common-mode drive by the signal that is subjected to a rectangular window process) in the prior art every frequency. As apparent from FIG. 6, in the speaker array 100 according to the present embodiment, it is understood that the width of the main lobe can be narrowed in a low frequency range rather than the rectangular common-mode drive speaker array in the prior art.

Also, as apparent from FIG. 6, in the speaker array 100 according to the present embodiment, it is understood that, for example, when a certain value (e.g., 80°) is decided as the width of the main lobe, a lower limit of a frequency of the acoustic beam that can be output at the width of the main lobe (i.e., lower end fL of the band of the directional speaker array: see Non-Patent Literature 2 as to the details) can be lowered rather than the case where the rectangular common-mode drive in the prior art is carried out. Explaining in more detail, when the amplitude of the ripples in the non-physical area is set to “1” (FIG. 6: Gain 1), a lower end of the band of the speaker array is reduced by 20.0% rather than the case where the rectangular common-mode drive in the prior art is carried out, and also is reduced by 32.8% rather than the case where the rectangular common-mode drive in the prior art is carried out when the amplitude of the ripples in the non-physical area is set to “2” (FIG. 6: Gain 2). In other words, according to the speaker array 100 according to the present embodiment, the lower end of the band can be reduced in contrast to the rectangular common-mode drive speaker array in the prior art (i.e., the directivity in a low frequency range can be improved).

As explained above, in the speaker array 100 according to the present embodiment, the amplitude characteristic in which plural ripples exist in the stop band in the sectional shape in the spatial frequency direction and the amplitude of the ripple in the non-physical area out of these plural ripples is larger than the amplitude of the ripple in the physical area (in the present embodiment, the stop band two-stage equi-ripple characteristic shown in FIG. 2) when the frequency characteristic is represented by the two-dimensional frequency plane is set in the two-dimensional digital filter. As a result, the directivity of the speaker array and the microphone array in the low frequency range can be improved not to extend an array length, and also an increase in the level of the side lobes can be avoided.

Then, a design of the two-dimensional digital filter to realize the stop band two-stage equi-ripple characteristic shown in FIG. 2 (i.e., calculation of the filter coefficients to be set in the one-dimensional digital filters 120-*i*) will be explained hereunder (A-3: Design of Two-dimensional Digital Filter)

Then, in the above Non-Patent Literature 2, it is disclosed that, when the amplitude characteristic of the two-dimensional digital filter constructed by a group of one-dimensional digital filters connected to respective speakers is viewed along the two-dimensional frequency plane, the frequency characteristic obtained when the output of the speaker array is observed from a sufficiently distant observation point corresponds to the amplitude characteristic that is distributed on a straight line expressed by following Formula 1 on the two-dimensional frequency plane.

$$f2=f1\cdot D\cdot\sin(\phi)/(c\cdot T) \qquad \text{(Formula 1)}$$

where f1 is a normalized time frequency, f2 is a normalized spatial frequency, D is a transducer interval, T is a time sampling period, and c is a velocity of sound.

Therefore, it is possible to say that the directional characteristic of the speaker array at a certain non-normalized time frequency f is distributed on a straight line that is specified by the normalized time frequency f1=f·T corresponding to the non-normalized time frequency f in the two-dimensional frequency plane to have a relationship given by following Formula 2.

$$\phi=\sin-1|(f2\cdot c\cdot T)/(f1\cdot D)| \qquad \text{(Formula 2)}$$

In other words, If the two-dimensional digital filter can be designed such that a desired directional characteristic at the non-normalized time frequency f is distributed on a straight line f1=f·T in a relationship given by above Formula 2, a desired directional characteristic can be derived as a result. In Non-Patent Literature 2, as described above, a method of obtaining FIR filter coefficients by setting a target characteristic of the two-dimensional digital filter by arranging one-dimensional filter characteristics on the section in the normalized spatial frequency direction (i.e., the f2 direction) on the two-dimensional frequency plane, and then applying the two-dimensional Fourier series approximation to the target characteristic is disclosed.

Explaining in detail, in Non-Patent Literature 2, design procedures of the two-dimensional digital filter applied when a center $\phi$0 of the acoustic beam, beam end angles ($\phi$s+, $\phi$s−), and a magnitude (amplitude) δ of the equi-ripple side lobe are given as the design conditions of the speaker array constructed by (N2+1) speakers are disclosed. Here, in the following, $\phi$0=0°, $\phi$s+=$\phi$s, $\phi$s−=−$\phi$s (i.e., the acoustic beam is symmetrical about the center ($\phi$0=0°)) are supposed.

Figures 7A, 7B:
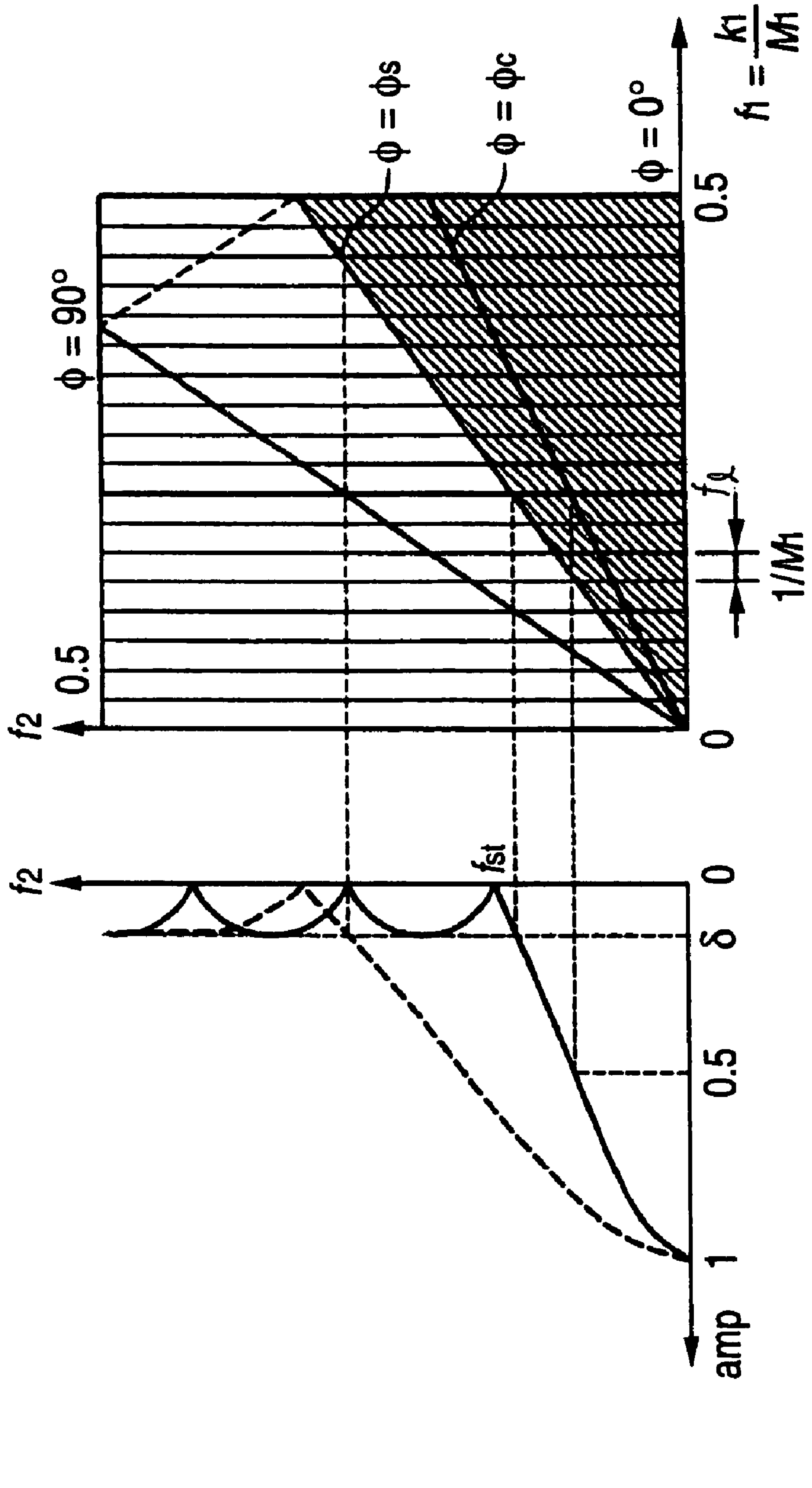
FIGS. 7A and 7B are views explaining a designing method of a sectional characteristic at $f1 \geqq fl$, disclosed in Non-Patent Literature 2.

In the design procedures disclosed in Non-Patent Literature 2, as shown in FIG. 7B, first the two-dimensional frequency plane is divided into M1 areas (in the present embodiment, M1 is the even number) in a range of f1=−0.5 to 0.5, and then the Dolph-Chebyshev characteristic is designed on the sections at respective frequencies f1=K1/M1 (an integer of k1=−M1/2 to M1/2) and aligned in parallel through the following procedures. Thus, the target fan filter characteristic is set Following explanation is in condition under a range of $f1 \geqq 0$.

Concretely, first the characteristic of the Dolph-Chebyshev characteristic whose degree is N2 and whose magnitude of the stop band ripple is δ is designed, and then the frequency f1 is calculated when a stop band end frequency fst agrees with a straight line $\phi=\phi s$ (i.e., a straight line expressed by $f2=f1 \cdot D \cdot \sin(\phi s)/(c \cdot T)$). Then, in the sectional position $f1 \geqq fl$, as shown in FIG. 7A, the sectional characteristic at f1=fl is expanded in the f2 direction and is arranged such that the stop band end is positioned on a straight line given by $\phi=\phi s$.

Figures 8A, 8B:
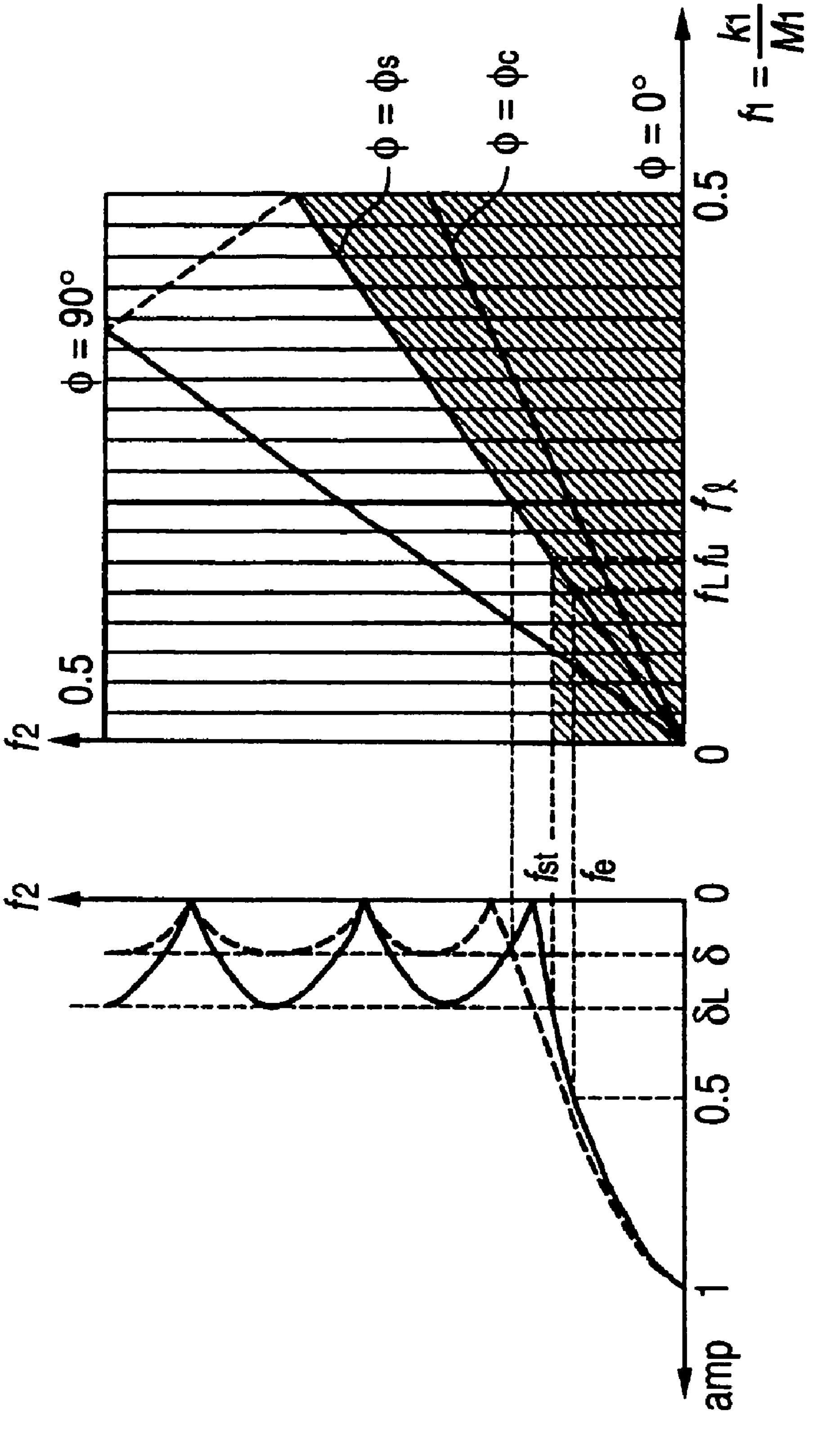
FIGS. 8A and 8B are views explaining a designing method of a sectional characteristic at $f1<fl$, disclosed in Non-Patent Literature 2.

In contrast, in the sectional position f1<fl, as shown in FIG. 8A, the Dolph-Chebyshev characteristic (f2=−0.5 to 0.5) an amplitude of the stop band ripple of which is increased gradually from δ to a predetermined tolerance δL is arranged. In this case, the stop band ripple is decided in such a manner that the stop band end frequency fst is positioned on a straight line given by $\phi=\phi s$ in all sections. Then, as shown in FIG. 8B, in the sectional position f1<fu where fu is a value of the frequency f1 at which the characteristic of the stop band ripple δL is placed at first, the same characteristic as the sectional characteristic of f1=fu is placed in f1<fu. Here, fL in FIG. 8B is the band lower end of the speaker array and is a value decided by following Formula 3.

$$fL=c \cdot T \cdot fc/D \sin(\phi_s) \quad \text{(Formula 3)}$$

where fc is a half amplitude frequency of the Dolph-Chebyshev filter characteristic of the stop band ripple δL shown in FIG. 8A.

Subsequently, the filter coefficient to be set in each one-dimensional digital filter is calculated by applying the two-dimensional inverse discrete Fourier transform to the target amplitude characteristic of the fan filter that is set in this manner.

Figures 9A, 9B:
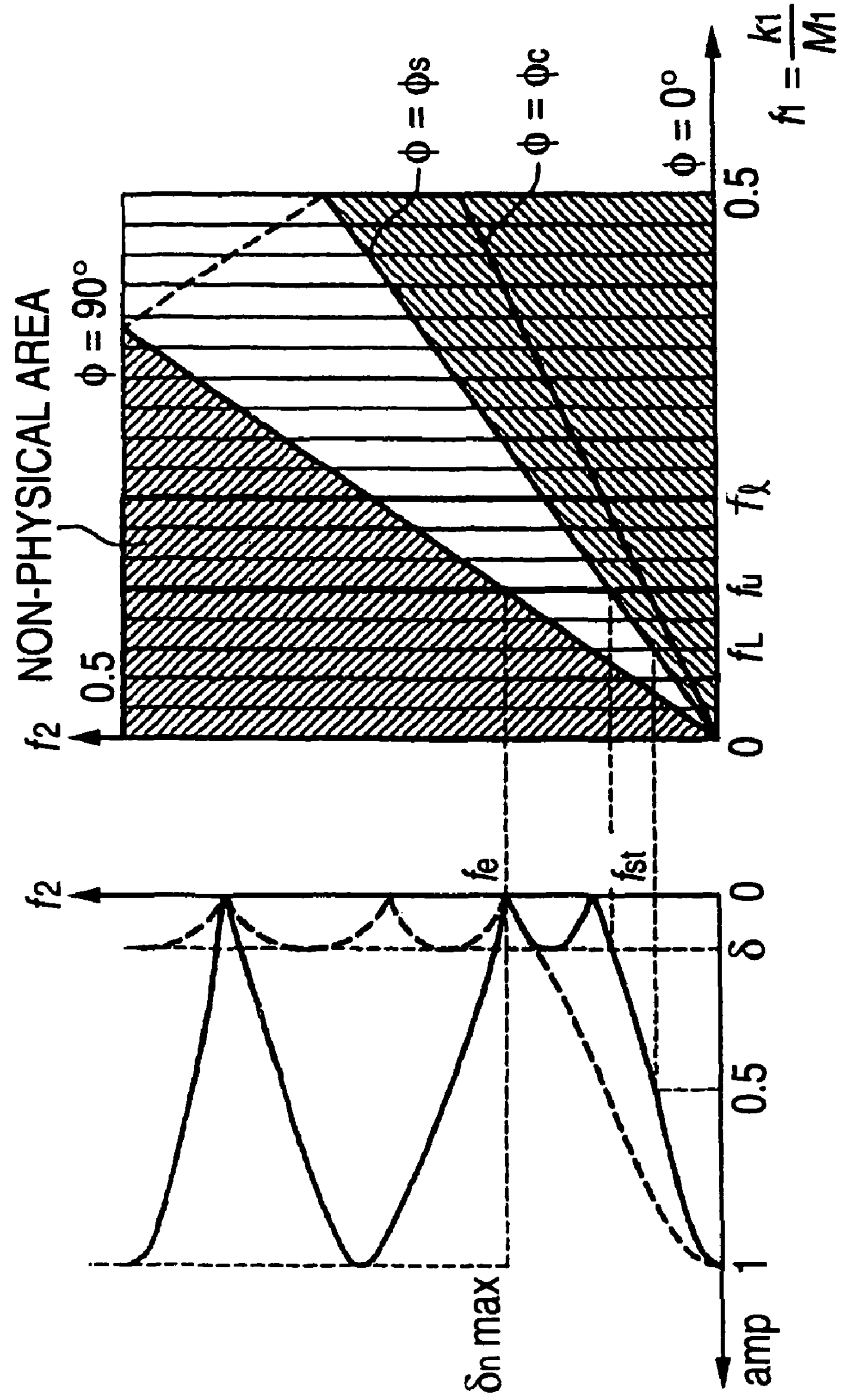
FIGS. 9A and 9B are views explaining a designing method of a sectional characteristic according to the present embodiment.

In contrast, in the design of the two-dimensional digital filter of the speaker array 100 according to the present embodiment, as shown in FIG. 9B, the one-dimensional filter having small ripples in all stop bands is set as the sectional characteristic at $f1 \geqq fl$ on the two-dimensional frequency plane that is divided into M1. In contrast, the one-dimensional filters having large ripples are set as the section only in the non-physical area (shaded portion in FIG. 9B) at f1<fl. Two amplitude characteristics shown in FIG. 9A are the amplitude characteristic of the one-dimensional filters being put on the sectional plane respectively. As can be understood from comparison between two amplitude characteristics, since the ripple is set large in the non-physical area, the frequency range that the ripple occupies is broadened and conversely the pass band is narrowed. Therefore, in the design of the two-dimensional digital filter according to the present embodiment, the one-dimensional filters are put in the sectional position of the time frequency in the lower frequency range until the amplitude of the ripple in the non-physical area reaches a predetermined maximum value.

In the present embodiment, in order to design the one-dimensional filter having the stop band two-stage equi-ripple characteristic shown in FIG. 9A, the program that executes the filter design according to the Parks & McClellan equi-ripple filter designing algorithm is utilized. Here, the "Parks & McClellan equi-ripple filter designing algorithm" is the algorithm that designs the filter by using the Remez exchange algorithm and the weighted Chebyshev approximation theory such that a desired frequency response and an actual frequency response can be optimized. Since the filter designed according to this algorithm is optimal in a respect that a maximum error between the desired frequency response and the actual frequency response should be minimized, this filter is also called the mini-max filter. Also, since the filter designed according to this algorithm shows the equal ripple in this frequency response, this filter is also known as the equi-ripple filter. In the present embodiment, the case where the Parks & McClellan equi-ripple filter designing algorithm is utilized in designing the one-dimensional filter having the stop band two-stage equi-ripple characteristic will be explained, but it is of course that other FIR filter designing algorithm may be employed.

Figure 10:
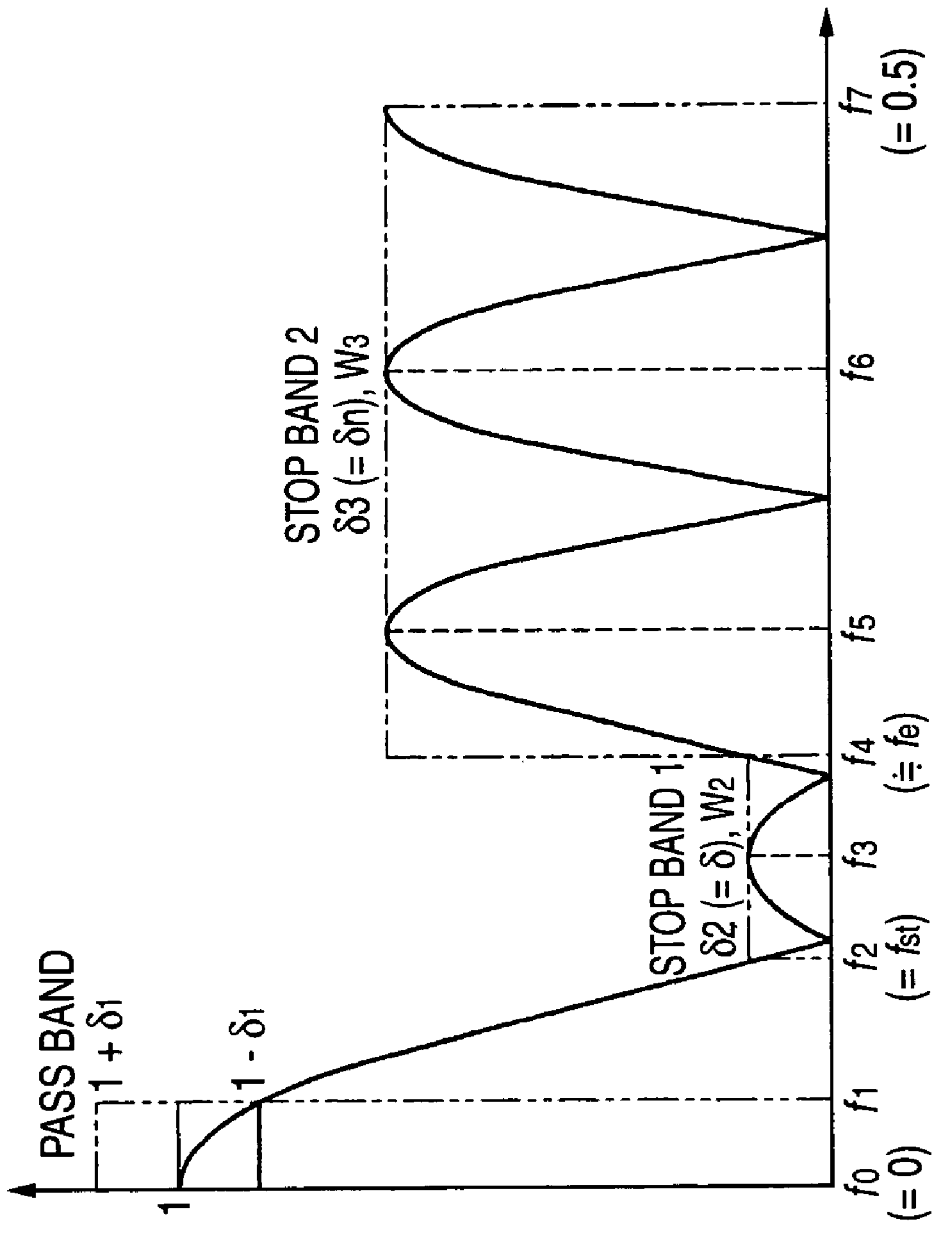
FIG. 10 is a graph showing a characteristic of a one-dimensional filter as the design result made by a Parks & McClellan equi-ripple filter design program.

FIG. 10 is a graph showing a characteristic of the design result and parameters given to the above program. As shown in FIG. 10, in the present embodiment, three approximate bands (pass band, stop band 1, stop band 2) are set, then target amplitudes (1, 0, 0 respectively) of respective approximate bands, error ripples ($\delta1 \approx 0$, $\delta2=\delta$, $\delta3=\delta n$ respectively), and weights (w1, w2, w3 respectively) are decided as parameters specifying respective approximate bands, and then the filter coefficients are decided by executing the repetitive approximation under the condition $\delta1w1=\delta2w2=\delta3w3$. Accordingly, the one-dimensional filter is designed.

Figure 11:
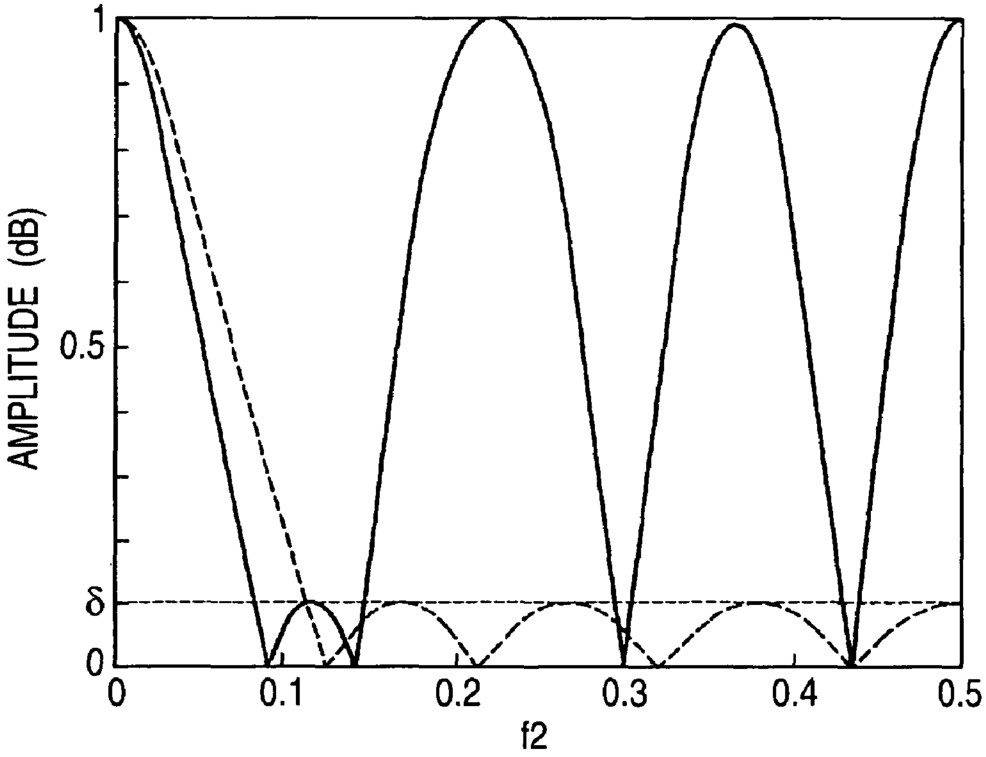
FIG. 11 is a graph showing a design example made by the Parks & McClellan equi-ripple filter design program and a design example of a one-dimensional filter having the Dolph-Chebyshev characteristic.

FIG. 11 is a graph showing the one-dimensional filter designed according to the Parks & McClellan equi-ripple filter design algorithm and a design example of the one-dimensional filter having the Dolph-Chebyshev characteristic As apparent by referring to FIG. 11, it is understood that a width of the pass band is narrowed in the former one-dimensional filter rather than the latter by increasing the ripple in the stop band 2. In this manner, in the characteristic in which the number of the ripples in the non-physical area occupied in a total number of the ripples in the stop area becomes larger, the effect of narrowing the width of the pass band becomes more conspicuous. In this case, theoretically the amplitude of the ripples in the non-physical area can be set as large as the designer likes. But practically an upper limit of the amplitude must be set adequately For example, "1" (i.e., a value that is equal to the amplitude of the pass band), "2" (a value that is twice the amplitude of the pass band), or the like may be set as this upper limit.

The filter coefficients, which are set to the one-dimensional digital filters constituting the two-dimensional digital filter respectively, are calculated by applying the two-dimensional inverse discrete Fourier transform to the target amplitude characteristic of the two-dimensional digital filter designed in this manner. Then, the amplitude characteristic shown in FIG. 2 is given to the two-dimensional digital filter, which is constructed by these one-dimensional digital filters, by setting the filter coefficients calculated in this fashion to respective one-dimensional digital filters 120-*i*.

(A-4: Advantages of First Embodiment)

As explained above, the characteristic in the physical area directly affects the directional characteristic whereas the characteristic in the non-physical area does not directly affect the directional characteristic. For this reason, in the speaker array 100 according to the present embodiment, the width of the main lobe can be reduced as the final characteristic of the filter coefficients by using the one-dimensional filters having the stop band two-stage equi-ripple characteristic, while keeping the level of the side lobe in the low frequency range.

Also, according to the present embodiment, the width of the main lobe can be maintained constant while suppressing the influence of the side lobe low even in the range lower than the prior art, by adjusting optimally the one-dimensional filters in response to f1. As described above, the width of the main lobe depends on the number of ripples in the non-physical area and the amplitude. Therefore, if the amplitude and the number being set to the ripples in the non-physical area are adjusted such that the necessary directional characteristic can be obtained in response to f1, the width of the main lobe can be kept constant in the range lower than the prior art.

Also, the width of the main lobe can be sufficiently narrowed unless the amplitude of the ripples in the non-physical area is increased in the range in which the time frequency is relatively high (for example, the range specified by fl≦f1 in Non-Patent Literature 2). Therefore, the Dolph-Chebyshev characteristic disclosed in Non-Patent Literature 2, for example, may be used instead of the stop band two-stage equi-ripple characteristic. Also, if the width of the main lobe is set not to depend on the time frequency as disclosed in Non-Patent Literature 2, the directional characteristic that does not depend on the frequency can be obtained in the range wider than the prior art, together with improvement of the characteristic in the low frequency range according to the present embodiment.

B. Second Embodiment

Then, a microphone array 200 according to a second embodiment of the present invention will be explained hereunder.

Figure 12:
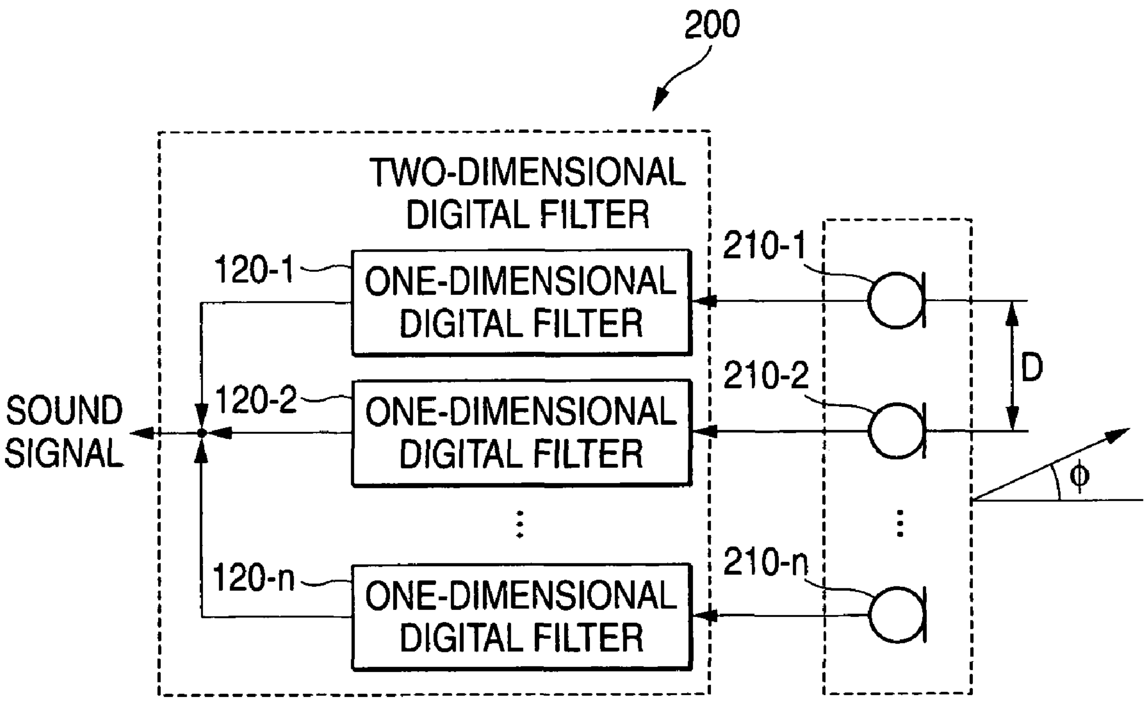
FIG. 12 is a block diagram showing an electric configuration of a microphone array 200 according to a second embodiment of the present invention.

FIG. 12 is a block diagram showing a configurative example of the microphone array 200 according to a second embodiment of the present invention. As apparent from the comparison between FIG. 12 and FIG. 1, a difference of the configuration of the microphone array 200 from the configuration of the speaker array 100 resides in that microphones 210-*i* (i: the natural number of 1 to n) for outputting the sound signal corresponding to the absorbed voice are provided in place of the speakers 110-*i* (i: the natural number of 1 to n).

In the microphone array 200, the sound signal output from the microphones 210-*i* is converted into the sound data by an A/D converter (not shown), and then input into the one-dimensional digital filters 120-*i*. Then, the foregoing filtering process is applied to the sound data by respective one-dimensional digital filters 120-*i*, then the sound data that are subjected to the filtering process and are output from respective one-dimensional digital filters are added together by an adder (not shown), and then a sum signal as the added result is output.

Then, in the microphone array, it is known commonly that, when the amplitude characteristic of a one-dimensional digital filter group connected to respective microphones (in the present embodiment, the microphones 210-*i*) constituting the microphone array is viewed on a two-dimensional frequency plane, the time frequency characteristic of a plane wave coming from an angle ϕ direction shown un FIG. 12 is distributed on a straight line given by above Formula 2. Therefore, if the filter coefficient explained in the above first embodiment is set to the one-dimensional digital filters 120-*i* respectively, the same effect as the first embodiment (i.e., the effect such that the directivity of the microphone array in a low frequency range can be improved without extension of an array length, and also an increase in level of the side lobes can be avoided) can be achieved on the directional characteristic of the microphone array 200.

C. Variation

With the above, the embodiments of the present invention are explained. It is of course that variations explained hereunder may be applied to the above embodiments.

(1) In the above embodiments, the case where the acoustic beam that is symmetrical about a center axis of the pass band is formed is explained. But an acoustic beam that is not symmetrical about an axis of symmetry can be formed.

(2) In the above embodiments, the case where the speakers 110-*i* and the microphones 210-*i* have the Ideal characteristic respectively is explained. In this case, since it is common that the transducer such as the speaker, the microphone, and the like have the frequency-depending directional characteristic, the amplitude characteristic given to the two-dimensional digital filter (i.e., the filter coefficients to be set to respective one-dimensional digital filters 120-*i*) may be decided by taking the frequency-depending directional characteristic of the transducer into consideration. This arrangement can be realized by applying the same method as the method disclosed in K. Nishkawa, T. Ohsaki "Directional Array Speaker Using Two-dimensional Digital Filter", (1995), for example.

Figure 13:
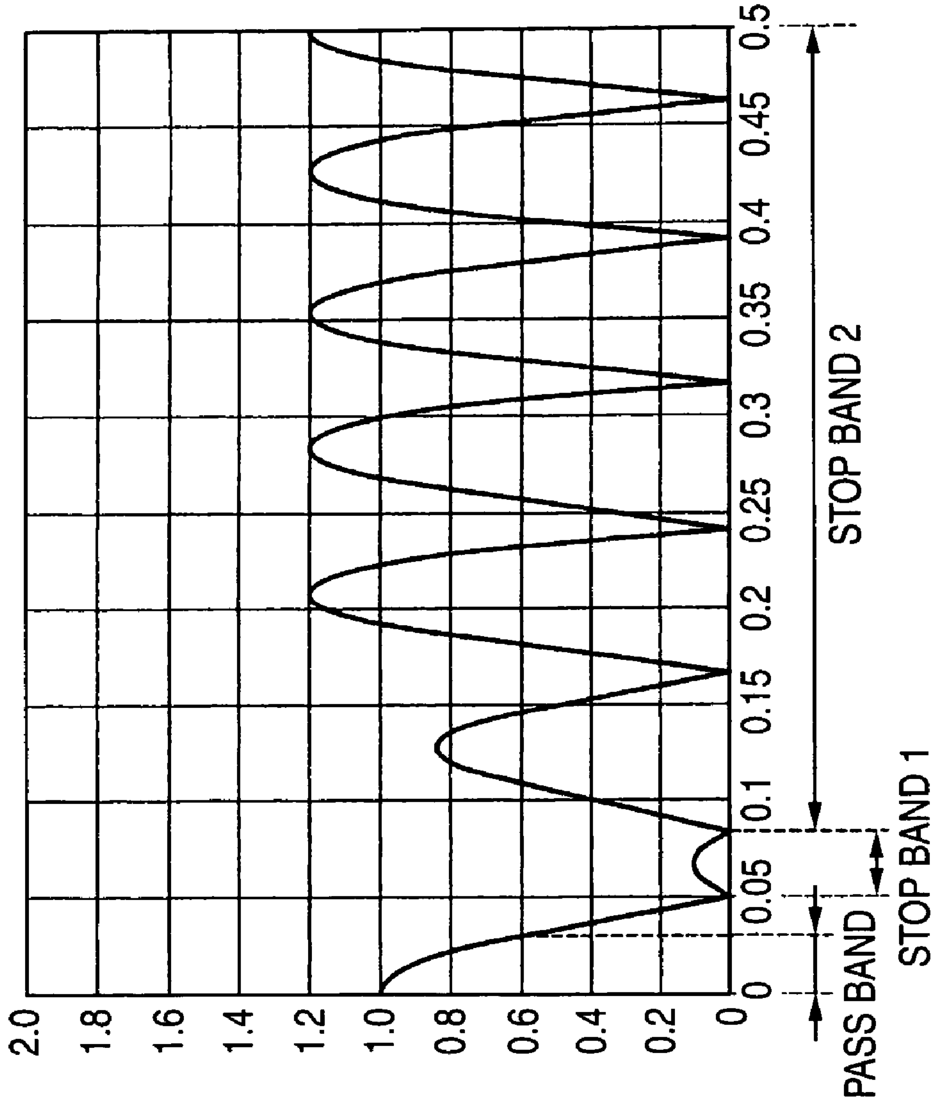
FIG. 13 is a graph showing a frequency characteristic according to a variation (3).

(3) In the above embodiments, the case where the amplitude characteristic having the stop band two-stage equi-ripple characteristic in which the equi-ripples having the large amplitude are provided in the non-physical area of the stop band whereas the ripples having the amplitude that is smaller than the ripples in the non-physical area (in the above embodiments, "δ=0.1") are provided in the physical area is given to the two-dimensional digital filter is explained. In this case, the equi-ripples are not always provided as the ripples in the non-physical area. For example, as shown in FIG. 13, the stop band multi-stage equi-ripple characteristic in which the ripples having the amplitude that is larger than that in the pass band and the ripples having the amplitude that is smaller than such ripples but larger than that of the ripples in the stop band (stop area 1 in FIG. 13) in the physical area are provided in the stop band (stop band 2 in FIG. 13) in the non-physical area may be given. In summary, if it can be accomplished by the frequency characteristic that the plurality of ripples can be provided in the stop band and also the amplitude of the ripples in the non-physical area is set larger than the amplitude of the ripples in the physical area, any frequency characteristic may be employed as the frequency characteristic of the two-dimensional digital filter of the speaker array or the microphone array according to the present invention, (4) in the above embodiments, the case where the filter coefficients peculiar to the speaker array according to the present invention are set previously in respective one-dimensional digital filters constituting the two-dimensional digital filter is explained. In this case, the filter coefficients may be calculated sequentially and set every time when the speaker array or the microphone array according to the present invention is used. With this approach, for example, when the speaker array or the microphone array according to the present invention is provided to an acoustical space such as a concert hall, or the like and used, the directional characteristic can be ser appropriately in answer to the acoustical characteristics of the acoustical space such as a space, a shape, etc. of the acoustical space.

Also, the filter coefficients set in respective one-dimensional digital filters may be provided from the outside of the speaker array or the microphone array. Concretely, a communicating unit such as NIC (Network Interface Card), or the like, for example, and a filter coefficient setting unit for setting the filter coefficients acquired by using the communicating unit via the communication network to respective one-dimensional digital filters may be provided to the speaker array or the microphone array. Also, of course a reading unit for reading the data from the computer-readable recording medium such as CD-ROM (Compact Disk-Read Only Memory), or the like, for example, may be provided instead of the communicating unit, then the filter coefficients may be written into the recording medium and distributed, and then the filter coefficients read by the reading unit may be set in respective one-dimensional digital filters by the filter coefficient setting unit.

What is claimed is:

1. A speaker array, comprising:

a plurality of speakers which are linearly arranged at a predetermined interval; and one-dimensional digital filters which are provided to correspond to the speakers respectively, in which predetermined filter coefficients are set previously, and which apply a filtering process to input sound data in response to the filter coefficients to output, wherein sound data derived by applying a digital conversion to input sound signals are supplied to respective one-dimensional digital filters;

wherein sound signals derived by applying an analog conversion to the sound data output from respective one-dimensional digital filters are supplied to corresponding speakers to output a sound in response to the sound signals; and wherein the filter coefficients set in respective one-dimensional digital filters give an amplitude characteristic to a two-dimensional digital filter such that, when a frequency characteristic of the two-dimensional digital filter constructed by respective one-dimensional digital filters is represented by a two-dimensional frequency plane, a plurality of ripples, are provided in a stop band in the cross-section of a spatial frequency direction and also an amplitude of ripples in the non-physical area out of the plurality of ripples is larger than an amplitude of ripples in the physical area.

2. The speaker array according to claim 1, wherein the ripples in the non-physical area have substantially same amplitudes to each other.

3. A microphone array, comprising:

a plurality of microphones which are linearly arranged at a predetermined interval; and one-dimensional digital filters which are provided to correspond to the microphones respectively, in which predetermined filter coefficients are set previously, and which apply a filtering process to input sound data in response to the filter coefficients to output, wherein sound data derived by applying a digital conversion to sound signals output from the microphones respectively are supplied to corresponding one-dimensional digital filters;

wherein a sum signal of sound data output from respective one-dimensional digital filters is output; and wherein the filter coefficients set in respective one-dimensional digital filters give an amplitude characteristic to a two-dimensional digital filter such that, when a frequency characteristic of the two-dimensional digital filter constructed by respective one-dimensional digital filters is represented by a two-dimensional frequency plane, a plurality of ripples are provided in a stop band in the cross-section of a spatial frequency direction and also an amplitude of ripples in the non-physical area out of the plurality of ripples is larger than an amplitude of ripples in the physical area.

4. The microphone array according to claim 3, wherein the ripples in the non-physical area have substantially same amplitudes to each other.

* * * * *